United States Patent [19]
Park et al.

[11] Patent Number: 5,962,186
[45] Date of Patent: *Oct. 5, 1999

[54] POLYMER FOR CHEMICAL AMPLIFIED POSITIVE PHOTORESIST COMPOSITION CONTAINING THE SAME

[75] Inventors: Joo Hyeon Park; Seong Ju Kim; Ji Hong Kim; Ki Dae Kim, all of Taejeon, Rep. of Korea

[73] Assignee: Korea Kumho Petrochemical Co., Ltd., Seoul, Rep. of Korea

[ * ] Notice: This patent is subject to a terminal disclaimer.

[21] Appl. No.: 08/948,933

[22] Filed: Oct. 10, 1997

[30] Foreign Application Priority Data

Oct. 11, 1996 [KR] Rep. of Korea ............ 96-45218

[51] Int. Cl.⁶ .............. G03F 7/004; C08F 212/02
[52] U.S. Cl. ............. 430/270.1; 430/905; 430/910; 526/313; 526/314
[58] Field of Search ............... 430/270.1, 905, 430/910; 526/313, 314

[56] References Cited

U.S. PATENT DOCUMENTS

| | | | |
|---|---|---|---|
| 5,558,978 | 9/1996 | Schadeli et al. | 430/270.1 |
| 5,679,495 | 10/1997 | Yamachika et al. | 430/910 |
| 5,750,309 | 5/1998 | Hatakeyama et al. | 430/170 |
| 5,770,345 | 6/1998 | Babich et al. | 430/270.1 |

*Primary Examiner*—John S. Chu
*Attorney, Agent, or Firm*—Harrison & Egbert

[57] ABSTRACT

A positive chemical amplified photoresist composition comprising as a matrix resin a polymer having the repeating unit of Formula (I) and a photoacid generator. The polymer ranges, in polystyrene-reduced weight average molecular weight, from about 2,000 to 1,000,000. The photoresist composition is possible to develop in alkali and shows excellent sensitivity, resolution and transmissivity to deep uv light in addition to being superior in storage preservativity. The repeating unit is:

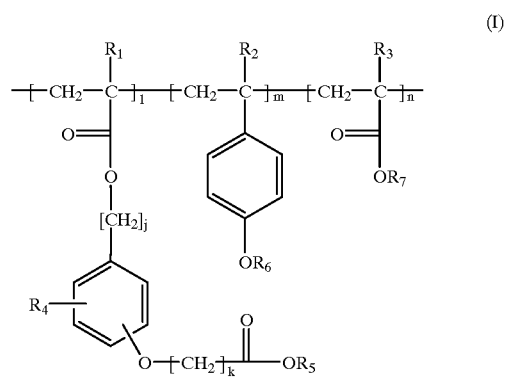

(I)

wherein, $R_1$, $R_2$ and $R_3$ are independently represented by a hydrogen atom or a methyl group; $R_4$ is a hydrogen atom, an alkyl group or an alkoxy group; $R_5$, $R_6$ and $R_7$ are independently represented by a hydrogen atom, a methyl group, an ethyl group, a t-butyl group, a tetrahydropyranyl group or an alkoxymethylene group; j is an integer of 1–8; k is an integer of 0–8; and l, m and n each represent a mole ratio, satisfying the condition of $1=0.1\sim0.5/l+m+n$, $m=0.3\sim0.8/l+m+n$, $n=0.1\sim0.4/l+m+n$ and l+m+n+l. The acid labile protective group can be the t-butyl group, the tetrahydropyranyl group or the alkoxymethylene group.

4 Claims, No Drawings

POLYMER FOR CHEMICAL AMPLIFIED POSITIVE PHOTORESIST COMPOSITION CONTAINING THE SAME

BACKGROUND OF THE INVENTION

1. Field of the Invention

The present invention relates to a polymer useful for positive photoresist and a positive photoresist composition containing the same.

2. Description of the Prior Art

The high integration of semiconductor devices has always been followed by significant advance in lithography. Using the g-line(wavelength 436 nm) or i-line(wavelength 365 nm) is limited in the preparation the high integration of semiconductor devices. Accordingly, as the light sources used to form the fine patterns become shorter in wavelength from g-line to uv light and deep uv light, excimer laser, such as a KrF laser and ArF laser, and electron beams, the development of the compositions corresponding to the light sources are essential for the lithography.

Active research has been directed to the development of chemical amplified photoresists used deep UV light, further to KrF laser. These photoresist prepared from a compound which generates acid upon radiation(hereinafter referred to as "photoacid generator"), and resin containing high content of acid-decomposable radical.

For example, a photoresist prepared from a matrix resin containing high content of acid-decomposable radical and photoacid generator is disclosed in Japanese Patent Publication No. 27600/1997, Japanese Patent Laid-Open Publication No. 27829/1988, U.S. Pat. No. 5,310,619 and U.S. Pat. No. 4,491,628.

However, these conventional resists show a problem in that desired patterns profile cannot be obtained because the formation of the T-top by the base component in the air, the decrease of the effect of dissolution inhibits developed in alkali solution and the existence of scum after developing, and thermally resistance is poor.

SUMMARY OF THE INVENTION

Having tried to solve the above problems encountered in prior arts through intensive and thorough experiments, the present inventors developed a novel photoresist polymer and affords its photoresist physical properties suitable for the high integration of semiconductor devices in used UV light, deep UV light, excimer laser, X-ray and electron beam.

Therefore, it is an object of the present invention to provide a positive photoresist polymer which is sensitive to various radiations such as UV light, deep UV light, excimer laser, X-ray and electron beam.

It is another object of the present invention to provide a positive photoresist composition which is superior in high sensitivity to various radiations and can form itself into a resist pattern with an excellent profile irrespective of the substrate employed.

In accordance with an aspect of the present invention, there is provided a copolymer having the repeating unit represented by the following formula (I):

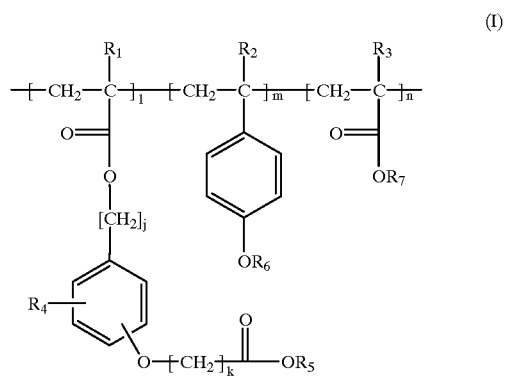

wherein, $R_1$, $R_2$ and $R_3$ are independently represented by a hydrogen atom or a methyl group; R4 is a hydrogen atom, an alkyl group or an alkoxy group; $R_5$, $R_6$ and $R_7$ are independently represented by a hydrogen atom, a methyl group, an ethyl group, a t-butyl group, a tetrahydropyranyl group or an alkoxymethylene group; j is an integer of 1–8; k is an integer of 0–8; and l, m, and n each represent a mole ratio, satisfying the condition of $l=0.1\sim0.5/l+m+n$, $m=0.3\sim0.8/l+m+n$, $n=0.1\sim0.4/l+m+n$ and $l+m+n=1$. The t-butyl group, the tetrahydropyranyl group and the alkoxymethylene group are the acid labile protective group.

In accordance with another object of the present invention, there is provided a positive photoresist composition containing the copolymer of Formula (I) as a matrix resin.

DETAILED DESCRIPTION OF THE INVENTION

The polymer of Formula (I) can be obtained by polymerizing the monomers, represented by the following formulas (II), (III) and (IV):

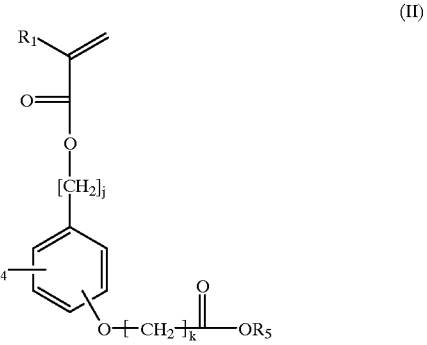

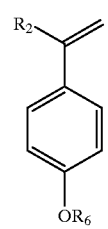

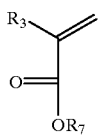
(IV)

wherein $R_1$, $R_2$ and $R_3$ are independently represented by a hydrogen atom or a methyl group; $R_4$ is a hydrogen atom, an alkyl group or an alkoxy group; $R_5$, $R_6$ and $R_7$ are independently represented by a hydrogen atom, a methyl group, an ethyl group, a t-butyl group, a tetrahydropyranyl group or an alkoxymethylene group; j is an integer of 1–8; and k is an integer of 0–8. The t-butyl group, the tetrahydropyranyl group and the alkoxymethylene group are the acid labile group.

In accordance with the present invention, the monomer of Formula (II) may be polymerized with the monomer of Formula (III) and/or the monomer of Formula (IV), to produce a copolymer or a terpolymer. Alternatively, the monomer of Formula (II) may be polymerized alone, to produce a homopolymer. The copolymer or terpolymer may belong to a type of a block polymer, a random polymer or a graft polymer.

The polymer of Formula (I) may be obtained through various techniques, including radical polymerization, cation polymerization and anion polymerization. Of them radical polymerization is more preferred. When the polymer is synthesized through a radical polymerization technique, the reaction solvent is used organic solvent such as aromatic hydrocarbon, cyclic ester and aliphatic hydrocarbon. For example, the reaction solvent is selected from benzene, toluene, xylene, dioxane, tetrahydrofuran, hexane, cyclohexane, diethoxyethane and the mixtures thereof.

The radical polymerization starts by the action of a radical polymerization initiator. Common radical polymerization initiators may be used. The examples of the initiator, not limitative but illustrative, include azobisisobutyronitrile, benzoylperoxide, laurylperoxide, azobisisocapronitrile, and azobisisovaleronitrile.

When the monomers of Formula (II) are polymerized alone, the resulting homopolymer has a disadvantage of low glass transition temperature. To overcome this disadvantage, the monomer of Formula (III) participates in the polymerization. The monomer of Formula (III) moiety of the resulting copolymer plays a role of increasing the glass transition temperature as well as increasing the sensitivity. Further, to enhance the adhesiveness to semiconductor substrate, the monomer of Formula (IV) is added upon the polymerization. That is, a terpolymer of the monomers of Formulas (II), (III) and (IV) is high in glass transition temperature, showing strong adhesiveness to semiconductor substrate.

The concentration of the monomer in polymerization is from 1 to 50 weight %, and preferably from 1 to 30 weight %. The polymerization carried out under an inert atmosphere such as argon or nitrogen with stirring. The polymerization time is from 30 minutes to 5 hours.

Depending on the polymerization initiator, the selection of a polymerization temperature is left open. For example, when the radical polymerization is carried out in the presence of azobisisobutyronitrile, the reaction temperature preferably ranges from 60° C. to 90° C.

After the completion of the polymerization, methanol, water or dichloromethane is added to stop the reaction or the reactant mixture containing the polymer produced is dissolved in a solvent such as methanol, hexane, heptane, and then filtered and dried, the polymer is obtained.

As for the molecular weight of the polymer produced, it can be controlled by adjusting the amount of polymerization catalyst and the reaction time. In accordance with the present invention, the polymer ranges, in polystyrene-reduced weight average molecular weight, from about 1,000 to 1,000,000, and preferably from about 4,000 to 70,000. If the molecular weight is lower than 4,000, the resulting photoresist is poor in coatability and thermal resistance. On the other hand, if the molecular weight is over 70,000, the other properties, that is, sensitivity, resolution and developing property, become inferior. It is preferred that the polymer has a molecular distribution (Mw/Mn) ranging from 1 to 5 and more preferably 1.2 to 2.5.

After the completion of the polymerization, un-reacted monomer residues must be at an amount of 10 weight % or less based on the weight of the polymer produced and preferably 3 weight % or less.

If the compositions are subjected to a baking process with the lapse of time after exposure to light, patterns are developed into a T-top shape. To prevent T-top shape pattern, it may be used a compound having amide.

As described above, the positive photoresist composition of the present invention comprises a photoacid generator. It may be selected from onium salts including iodonium salts, sulfonium salts, phosphonium salts, diazonium salts and pyridium salts. More preferable examples of photoacid generator include triphenylsulfonium triflate, diphenyl(4-methylphenyl)sulfonium triflate, diphenyl(4-t-butylphenyl) sulfonium triflate, diphenyl(4-methoxyphenyl)sulfonium triflate, triphenylsulfonium hexafluoroantimonate, diphenyliodonium triflate, diphenyliodonium methylbenzenesulfonate, bis(cyclohexylsulfonyl) diazomethane and bis(2,4-dimethylphenyl sulfonyl) diazomethane. The photoacid generator also can be selected from halogen compounds including 1,1-bis(4-chlorophenyl)-2,2,2-trichloroethane, phenyl-bis (trichloromethyl)-s-triazine, and naphthyl-bis (trichloromethyl)-s-triazine. Further, diazoketone compounds, such as 1,3-diketo-2-diazo compounds, diazobenzoquinone compounds and diazonaphthoquinone compounds, sulfone compounds, sulfonic acid compounds, and nitrobenzyl compounds can be used as the photoacid generator. Of them onium compounds and diazoketone compounds are preferable. Based on 100 weight parts of the total solid content of the composition, the photoacid generator is used at an amount of 0.1–30 weight parts and preferably 0.3–10 weight parts. The photoacid generators exemplified may be used alone or in combination with two or more species.

The photoresist composition of the present invention, if necessary, may comprise an acid-decomposable compound which promotes the dissolution of the composition in a developing solution. Preferred are the aromatic polyhydroxy compounds protected by t-butoxycarboxy group. They may be used alone or in combination and are added to the composition at an amount of 5–80 weight parts per 100 weight parts of the total solid content of the composition and preferably 10–50 weight parts.

In addition, if necessary, the photoresist composition of the present invention may be added with additives, including surfactant, azo compounds, halation inhibitor, adhesive aid, preservative, anti-foaming agent, etc.

If there is a need for the improvement in sensitivity or resolution, a light absorbent may be used. For this purpose, benzophenones or naphthoquinones as a light absorbent are added in the composition of the present invention at an amount of 0.2–30 weight % based on the total solid content and preferably 0.5–10 weight %.

To obtain a uniform and smooth coat, a solvent for the photoresist composition should have appropriate volatility and viscosity. The solvents showing such physical properties include ethyleneglycol monomethylether, ethyleneglycol monoethylether, ethyleneglycol monopropylether, ethyleneglycol monobutylether, diethyleneglycol dimethylether, diethyleneglycol diethylether, diethyleneglycol dipropylether, diethyleneglycol dibutylether, methylcellosolveacetate, ethylcellosolveacetate, propyleneglycol monomethylether acetate, propyleneglycol monoethylether acetate, propyleneglycol monopropylether acetate, methylethylketone, cyclohexanone, methyl 2-hydroxypropionate, ethyl 2-hydroxypropionate, 2-heptanone, N-methylpyrrolidone, N,N-dimethylformamide, N,N-dimethylacetamide, ethylpyruvate, n-amylacetate, ethyl lactate, and gamma-butyrolactone and, if necessary, may be used alone or in combination. As for the amount of solvent, it is dependent on the physical properties, that is, volatility and viscosity may be controlled in such a way that the composition be uniformly coated on a wafer.

A developing solution useful for the radiated film is selected from aqueous solutions containing sodium hydroxide, potassium hydroxide, sodium carbonate, sodium silicate, sodium methasilicate, ammonia water, ethyl amine, n-propylamine, triethylamine, tetramethylammonium hydroxide or tetraethylammonium hydroxide with preference to tetramethylammonium hydroxide. To the developing solution, surfactants and/or aqueous alcohols may be added. In this case, a washing process with water preferably follows the developing process.

Consequently, the positive photoresist according to the present invention is suitable for any radiation, including, for example, i-line (uv light), excimer laser (deep uv light), X-ray and electron beam (charged particle ray), as well as being superior in preservativity, resolution and patterning so that it can be useful for the fabrication of semiconductor devices.

A better understanding of the present invention may be obtained in light of following examples which are set forth to illustrate, but are not to be construed to limit, the present invention.

SYNTHESIS EXAMPLE I 0.06 mole (8.3 g) of 4-hydroxyphenylethanol, 0.08 mole (9.0 g) of potassium carbonate and 0.02 mole (2.0 g) of potassium iodide were dissolved in 300 ml of acetonitrile in a 500 ml four-necked flask. Meanwhile, 0.06 mole (12.9 g) of t-butyl bromoacetate was dropwise added with stirring in the flask. After the completion of the addition, the solution was reacted at 80° C. for 10 hours. After the solvent was removed, the reaction mixture was diluted with ethyl acetate, washed with 5% NaOH aqueous solution and then, with distilled water, and dried, to produce an intermediate, represented by the following formula (II-1')

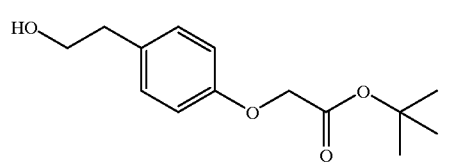

(II-1')

This intermediate product was used without further purification. The intermediate product (II-1') was dissolved in 400 ml of dichloromethane, added with 0.08 mole (6.5 g) of methacryloyl chloride, and cooled to 0° C. and then dropwise added with 0.09 mole (9.6 g) of triethyl amine, the solution was stirred at room temperature for 4 hours and washed 2–3 times with a saturated sodium chloride solution. The organic phase thus separated was dried over anhydrous magnesium sulfate, filtered and completely deprived of the solvent, methylene chloride. Purification with silica gel column chromatography yielded 11.3 g of a monomer (II-1):

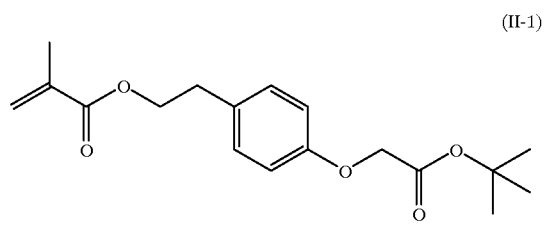

(II-1)

SYNTHESIS EXAMPLE II

An intermediate product (II-2') was obtained in a similar manner to that of Synthesis Example I except for using 0.06 mole (7.4 g) of 4-hydroxybenzyl alcohol instead of 4-hydroxyphenylethanol. The intermediate product was reacted with methacryloyl chloride, to yield 10.2 g of a monomer (II-2)

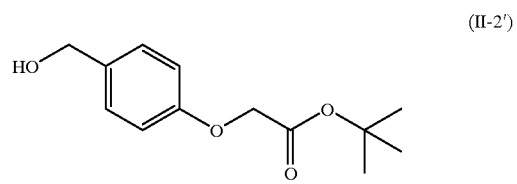

(II-2')

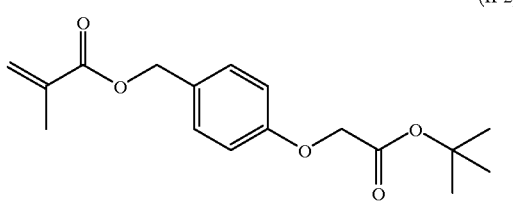

(II-2)

SYNTHESIS EXAMPLE III

An intermediate product (II-3') was obtained in a similar manner to that of Synthesis Example I except for using 0.06 mole (9.3 g) of 4-hydroxy-3-methoxybenzyl alcohol instead of 4-hydroxyphenylethanol. The intermediate product was reacted with methacryloyl chloride, to yield 12.3 g of a monomer (II-3).

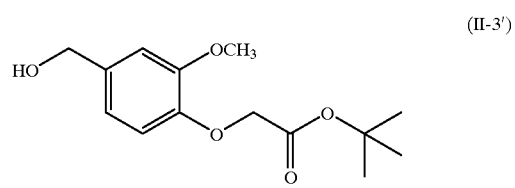

(II-3')

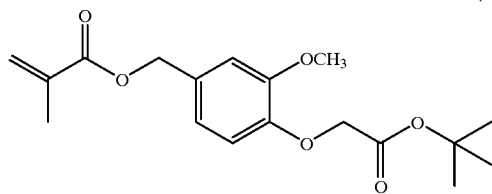

(II-3)

SYNTHESIS EXAMPLE IV 9.46 g of 4-hydroxybenzyl alcohol, 17.0 g of di-t-butyl dicarbonate were dissolved in 300 ml of dichloromethane in a 500 ml four-necked flask, and cooled 0° C. and then dropwise added with 8.0 g of triethylamine. The solution was stirred for 5 hours and then 10.0 g of triethylamine was dropwise added with stirring for 5 hours and washed with 5% NAOH aquous solution and then with distilled water, and deprived of the solvent. Purification with silica gel colum chromatography yield 17.5 g of a monomer(II-4).

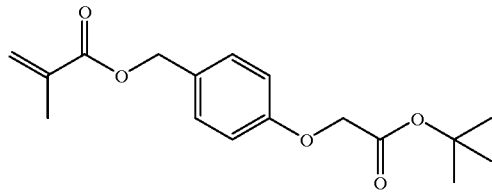

(II-4)

SYNTHESIS EXAMPLE V 9.8 g of the monomer (II-1) obtained in Synthesis Example I was dissolved in 17.3 g of toluene in a 100 ml reactor and AIBN (2,2'-azo-bisisobutyronitrile), acting as a polymerization initiator, was added at a concentration of 0.01 mol/l. At room temperature, the reactor was charged with nitrogen for 3 hours and then, the mixture was subjected to reaction for 2 hours with stirring at 70° C. After the completion of this polymerization, 10 ml of dichloromethane was poured to the reaction mixture to dissolve the polymer produced. Thereafter, the resulting solution was dropwise added in 1,000 ml of hexane, to give white precipitates which were, then, filtered and dried in vacuo for 20 hours, to yield 8.0 g of Resin (I). It had a polystyrene-reduced weight average molecular weight (hereinafter weight average molecular weight) of 45,000.

SYNTHESIS EXAMPLE VI

Using 8.0 g of the monomer (II-2) obtained in Synthesis Example II, the procedure of Synthesis Example V was repeated to produce 7.8 g of Resin (2). It was found to be 42,000 in weight average molecular weight.

SYNTHESIS EXAMPLE VII

Using 8.0 g of the monomer (II-3) obtained in Synthesis Example III, the procedure of Synthesis Example V was repeated to produce 7.5 g of Resin (3). It was found to be 39,000 in weight average molecular weight.

SYNTHESIS EXAMPLE VIII

Using 8.0 g of the monomer (II-4) obtained in Synthesis Example IV, the procedure of Synthesis Example V was repeated to produce 8.0 g of Resin (4). It was found to be 43,000 in weight average molecular weight.

SYNTHESIS EXAMPLE IX

Using 9.8 g of the monomer (II-1) obtained in Synthesis Example I and 5.2 g of acethoxystyrene, the procedure of Synthesis Example V was repeated to produce 8.5 g of Resin (5). It was found to be 37,000 in weight average molecular weight.

SYNTHESIS EXAMPLE X

Using 9.8 g of the monomer (II-2) obtained in Synthesis Example II and 5.2 acethoxystyrene, the procedure of Synthesis Example V was repeated to produce 8.3 g of Resin (6). It was found to be 45,000 in weight average molecular weight.

SYNTHESIS EXAMPLE XI

Using 9.8 g of the monomer (II-3) obtained in Synthesis Example III and 5.2 g of acethoxystyrene, the procedure of Synthesis Example V was repeated to produce 7.8 g of Resin (7). It was found to be 37,000 in weight average molecular weight.

SYNTHESIS EXAMPLE XII

Using 9.8 g of the monomer (II-1) obtained in Synthesis Example I, 5.2 g of acethoxystyrene and 2.8 g of methacrylic acid, the procedure of Synthesis Example V was repeated to produce 8.8 g of Resin (8). It was found to be 38,000 in weight average molecular weight.

SYNTHESIS EXAMPLE XIII

Using 9.8 g of the monomer (II-2) obtained in Synthesis Example II, 5.2 g of acethoxystyrene and 2.8 g of methacrylic acid, the procedure of Synthesis Example V was repeated to produce 8.5 g of Resin (9). It was found to be 33,000 in weight average molecular weight.

SYNTHESIS EXAMPLE XIV

Using 9.8 g of the monomer (II-3) obtained in Synthesis Example III, 5.2 g of acethoxystyrene and 2.8 g of methacrylic acid, the procedure of Synthesis Example V was repeated to produce 6.8 g of Resin (10). It was found to be 30,000 in weight average molecular weight.

SYNTHESIS EXAMPLE XV 5.0 g of Resin (5) obtained in Synthesis Example IX was dissolved in 100 ml of methanol, and cooled to 0° C., and then dropwise added with 7.8 g of 25% tetramethylammonium hydroxide aqueous solution, the solution was stirred at room temperature for 3 hours. After completion of stirring, small amount of acetic acid was dropped for neutralization. Thereafter, the resulting solution was dropwise added in 1,000 ml of hexane, to give precipitates which were, then, filtered and dried at room temperature for 20 hours, to yield 4.8 g of Resin (11). It was found to be 36,000 in weight average molecular weight.

SYNTHESIS EXAMPLE XVI

Using 4.8 g of the Resin (6) obtained in Synthesis Example X, the procedure of Synthesis Example XV was repeated to produce 4.5 g of Resin (12). It was found to be 44,000 in weight average molecular weight.

SYNTHESIS EXAMPLE XVII

Using 5.3 g of the Resin (7) obtained in Synthesis Example XI, the procedure of Synthesis Example XV was repeated to produce 4.3 g of Resin (13). It was found to be 36,000 in weight average molecular weight.

SYNTHESIS EXAMPLE XVIII

Using 5.5 g of the Resin (8) obtained in Synthesis Example XII, the procedure of Synthesis Example XV was repeated to produce 5.1 g of Resin (14). It was found to be 37,000 in weight average molecular weight.

SYNTHESIS EXAMPLE XIX

Using 5.0 g of the Resin (9) obtained in Synthesis Example XIII, the procedure of Synthesis Example XV was repeated to produce 4.6 g of Resin (15). It was found to be 31,000 in weight average molecular weight.

SYNTHESIS EXAMPLE XX

Using 4.8 g of the Resin (10) obtained in Synthesis Example XIV, the procedure of Synthesis Example XV was repeated to produce 3.5 g of Resin (16). It was found to be 28,000 in weight average molecular weight.

SYNTHESIS EXAMPLE XXI

Using 9.8 g of the monomer (II-2) obtained in Synthesis Example II, 5.2 g of acethoxystyrene in the presence of 0.2 mol/l of AIBN, the procedure of Synthesis Example V was repeated to produce 4.5 g of Resin (17). It was found to be 29,000 in weight average molecular weight.

SYNTHESIS EXAMPLE XXII

Using 9.8 g of the monomer (II-2) obtained in Synthesis Example II and 5.2 g of acethoxystyrene in the presence of 0.03 mol/l of AIBN, the procedure of Synthesis Example V was repeated to produce 4.2 g of Resin (18). It was found to be 16,000 in weight average molecular weight.

EXAMPLE I 100 weight parts of Resin (1) obtained in Synthesis Example V and 2.0 weight parts of triphenylsulfonium triflate were dissolved in 350 weight parts of ethyl lactate and filtered through a teflon filter with a pore size of 0.1 $\mu$m, to give a resist solution. It was spin-coated on a commonly washed silicon wafer, to form a uniform film 0.8 $\mu$m thick. The silicon wafer was baked at 90° C. for 90 sec and exposed through a mask to uv light of 248 nm in a KrF excimer laser steper. After this radiation, the wafer was thermally treated at 100° C. for 60 sec and developed in an aqueous 2.38 wt % tetramethylammonium hydroxide solution for 40 sec, to form a pattern. It was found to have a good cross section 0.38 $\mu$m thick at an exposure energy of 24 mJ/cm$^2$ as observed with an electron microscope.

EXAMPLE II

A similar procedure to that of Example I was repeated except that a resist solution was prepared by dissolving 100 weight parts of Resin (2) obtained in Synthesis Example VI and 2.4 weight parts of triphenylsulfonium triflate in 350 weight parts of ethyl lactate. The pattern obtained was found to have a good cross section 0.36 $\mu$m thick at an exposure energy of 20 mJ/cm$^2$ as observed with an electron microscope.

EXAMPLE III

A similar procedure to that of Example I was repeated except that a resist solution was prepared by dissolving 100 weight parts of Resin (3) obtained in Synthesis Example VII and 2.5 weight parts of triphenylsulfonium triflate in 350 weight parts of ethyl lactate. The pattern obtained was found to have a good cross section 0.36 $\mu$m thick at an exposure energy of 18 mJ/cm$^2$ as observed with an electron microscope.

EXAMPLE IV

A similar procedure to that of Example I was repeated except that a resist solution was prepared by dissolving 100 weight parts of Resin (11) obtained in Synthesis Example XV and 2.5 weight parts of triphenylsulfonium triflate in 350 weight parts of ethyl lactate. The pattern obtained was found to have a good cross section 0.34 $\mu$m thick at an exposure energy of 18 mJ/cm$^2$ as observed with an electron microscope.

EXAMPLE V

A similar procedure to that of Example I was repeated except that a resist solution was prepared by dissolving 100 weight parts of Resin (12) obtained in Synthesis Example XVI and 2.5 weight parts of triphenylsulfonium triflate in 350 weight parts of ethyl lactate. The pattern obtained was found to have a good cross section 0.34 $\mu$m thick at an exposure energy of 16 mJ/cm$^2$ as observed with an electron microscope.

EXAMPLE VI

A similar procedure to that of Example I was repeated except that a resist solution was prepared by dissolving 100 weight parts of Resin (13) obtained in Synthesis Example XVII and 2.5 weight parts of triphenylsulfonium triflate in 350 weight parts of ethyl lactate. The pattern obtained was found to have a good cross section 0.30 $\mu$m thick at an exposure energy of 16 mJ/cm$^2$ as observed with an electron microscope.

EXAMPLE VII

A similar procedure to that of Example I was repeated except that a resist solution was prepared by dissolving 100 weight parts of Resin (14) obtained in Synthesis Example XVIII and 2.5 weight parts of triphenylsulfonium triflate in 350 weight parts of ethyl lactate. The pattern obtained was found to have a good cross section 0.28 $\mu$m thick at an exposure energy of 16 mJ/cm$^2$ as observed with an electron microscope.

EXAMPLE VIII

A similar procedure to that of Example I was repeated except that a resist solution was prepared by dissolving 100 weight parts of Resin (15) obtained in Synthesis Example XIX and 2.5 weight parts of triphenylsulfonium triflate in 350 weight parts of ethyl lactate. The pattern obtained was found to have a good cross section 0.27 $\mu$m thick at an exposure energy of 16 mJ/cm$^2$ as observed with an electron microscope.

EXAMPLE IX

A similar procedure to that of Example I was repeated except that a resist solution was prepared by dissolving 100 weight parts of Resin (16) obtained in Synthesis Example XX and 2.5 weight parts of triphenylsulfonium triflate in 350 weight parts of ethyl lactate. The pattern obtained was found to have a good cross section 0.26 μm thick at an exposure energy of 16 mJ/cm$^2$ as observed with an electron microscope.

As described hereinbefore, the present invention is a polymer which can be sensitive to uv light, deep uv light, excimer laser, X-ray and electron beam and a positive chemical amplified photoresist composition based on the polymer, which is superior in thermal resistance, resolution and storage preservativity and can afford resist patterns of excellent profile irrespective of the substrates employed.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A polymer having the repeating unit represented by the following formula (I):

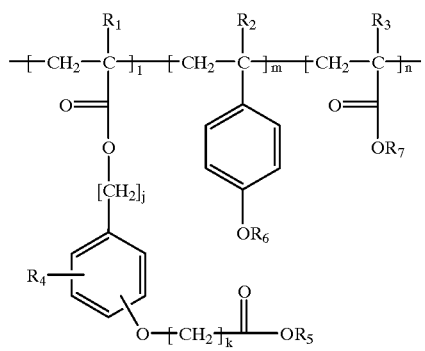

wherein $R_1$, $R_2$ and $R_3$ are independently selected from the group consisting of a hydrogen atom and a methyl group; $R_4$ is selected from the group consisting of a hydrogen atom, and alkyl group and an alkoxy group; $R_5$, $R_6$ and $R_7$ are independently selected from the group consisting of a hydrogen atom, a methyl group, an ethyl group, a t-butyl group, a tetrahydropyranyl group and an alkoxymethylene group; j is an integer of 1–8; k is an integer of 0–8; and l, m, and n each represent a mole ratio satisfying the condition of l=0.1~0.5/l+m+n, m=0.3~0.8/l+m+n, n=0.1~0.4/l+m+n and l+m+n=1, an acid labile protective group is selected from the group consisting of the t-butyl group, the tetrahydropyranyl I group and the alkoxymethylene group, the polymer having a polystyrene-reduce weight average molecular weight of 2,000 to 1,000,000.

2. A positive chemical amplified photoresist composition comprising as a matrix resin a polymer with a polystyrene-reduce weight average molecular weight of 2,000 to 1,000,000 having the repeating unit represented by the following formula (I):

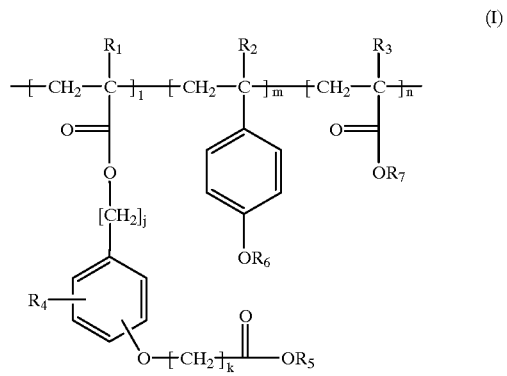

wherein $R_1$, $R_2$ and $R_3$ are independently selected from the group consisting of a hydrogen atom and a methyl group; $R_4$ is selected from the group consisting of a hydrogen atom, an alkyl group and an alkoxy group; $R_5$, $R_6$ and $R_7$ are independently selected from the group consisting of a hydrogen atom, a methyl group, an ethyl group, a t-butyl group, a tetrahydropyranyl group and an alkoxymethylene group; j is an integer of 1–8, k is an integer of 0–8; and l m, and n each represent a mole ratio satisfying the condition of l=0.1~0.5/l+m+n, m=0.3~0.8/l+m+n, n=0.1~0.4/l+m+n and l+m+n=1; an acid labile protective group is selected from the group consisting of the t-butyl group, the tetrahydropyranyl group and the alkoxymethylene soup; and a photoacid generator.

3. A positive chemical amplified photoresist composition in accordance with claim 2, wherein said photoacid generator is selected from the group consisting of bis (cyclohexylsulfonyl) diazomethane, bis(2,4-dimethylphenylsulfonyl)diazomethane, pyrogallol trimethylate, bis(4-t-butylphenyl)iodonium triflate, triphenylsulfonium triflate, diphenyl(4-t-butylphenyl)sulfonium triflate, diphenyl(4-methoxyphenyl)sulfonium triflate, diphenyl(4-methylphenyl)sulfonium triflate, and the mixtures thereof.

4. A positive chemical amplified photoresist composition in accordance with claim 2, wherein said photoacid generator is used at an amount of 0.1–30 weight parts per 100 weight parts of said polymer.

* * * * *